(12) United States Patent
Choi et al.

(10) Patent No.: US 11,980,054 B2
(45) Date of Patent: May 7, 2024

(54) DISPLAY APPARATUS HAVING HETEROMORPHY LENS

(71) Applicant: LG Display Co., Ltd., Seoul (KR)

(72) Inventors: Woo Chul Choi, Goyang-si (KR); Seung Kwang Roh, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 498 days.

(21) Appl. No.: 17/234,132

(22) Filed: Apr. 19, 2021

(65) Prior Publication Data

US 2022/0209196 A1 Jun. 30, 2022

(30) Foreign Application Priority Data

Dec. 29, 2020 (KR) ........................ 10-2020-0186503

(51) Int. Cl.
*H10K 50/858* (2023.01)
*G02B 3/02* (2006.01)
*G02B 3/00* (2006.01)
*H10K 59/12* (2023.01)

(52) U.S. Cl.
CPC ............. *H10K 50/858* (2023.02); *G02B 3/02* (2013.01); *G02B 2003/0093* (2013.01); *H10K 59/12* (2023.02)

(58) Field of Classification Search
CPC ...... H10K 50/858; H10K 50/844; G02B 3/02; G02B 3/08; G02B 3/0056; G02B 3/0087; G02B 2003/0093; G02B 6/003
See application file for complete search history.

(56) References Cited

U.S. PATENT DOCUMENTS

| | | | | |
|---|---|---|---|---|
| 2015/0276170 | A1* | 10/2015 | Motoyanagi | F21V 5/04 362/335 |
| 2016/0149163 | A1* | 5/2016 | Chen | G02B 3/0056 359/620 |
| 2020/0295308 | A1* | 9/2020 | Baek | H04N 13/307 |
| 2022/0085335 | A1* | 3/2022 | Shimatsu | H10K 59/38 |

FOREIGN PATENT DOCUMENTS

| | | |
|---|---|---|
| KR | 10-0917507 B1 | 9/2009 |
| KR | 10-1009707 B1 | 1/2011 |
| KR | 10-1050217 B1 | 7/2011 |
| KR | 10-1195653 B1 | 10/2012 |
| KR | 10-2018-0062113 A | 6/2018 |

\* cited by examiner

*Primary Examiner* — Farun Lu
*Assistant Examiner* — Sandra Milena Rodriguez Villanu
(74) *Attorney, Agent, or Firm* — POLSINELLI PC

(57) ABSTRACT

A display apparatus including a heteromorphy lens disposed on a path of light emitted from a light-emitting device, a side surface of the heteromorphy lens toward a first direction has a shape different from a side surface of the heteromorphy lens toward a second direction perpendicular to the first direction, so that light can be condensed in the first direction and diffused in the second direction due to the heteromorphy lens, and the reduction in luminance can be minimized, and the viewing angle can be limited.

15 Claims, 7 Drawing Sheets

DISPLAY APPARATUS HAVING HETEROMORPHY LENS

CROSS-REFERENCE TO RELATED APPLICATION

This application claims the benefit of Korean Patent Application Nos. 10-2020-0186503 filed on Dec. 29, 2020, which are hereby incorporated by reference in its entirety.

BACKGROUND

Field of the Disclosure

The present disclosure relates to a display apparatus in which a heteromorphy lens is disposed on a path of light emitted from a light-emitting device.

Description of the Background

In general, an electronic appliance such as a monitor, a TV, a laptop computer, and a digital camera includes a display apparatus to realize an image. For example, the display apparatus may include light-emitting devices. Each of the light-emitting devices may emit light display a specific color. For example, each of the light-emitting devices may include a light-emitting layer between a first electrode and a second electrode.

The display apparatus may limit a viewing angle so that an image provided to a user is not recognized by peripheral people. For example, the display apparatus may limit a traveling direction of light emitted from each light-emitting device by using a light control film (LCF) which includes a light-blocking pattern. The light control film may be located at the outermost. Thus, in the display apparatus, moire due to the light-emitting patterns which are repeated may occur. And, in the display apparatus, the reduction of luminance due to the light control film may occur. Therefore, in the display apparatus, the quality of the image may be deteriorated.

SUMMARY

Accordingly, the present disclosure is directed to a display apparatus that substantially obviates one or more problems due to limitations and disadvantages of the related art.

The present disclosure is to provide a display apparatus capable of preventing moire and realizing narrow viewing angle.

Also, the present disclosure is to provide a display apparatus capable of minimizing the reduction of the luminance and limiting the viewing angle.

Additional advantages and features of the disclosure will be set forth in part in the description which follows and in part will become apparent to those having ordinary skill in the art upon examination of the following or may be learned from practice of the disclosure. The features and other advantages of the disclosure may be realized and attained by the structure particularly pointed out in the written description and claims hereof as well as the appended drawings.

To achieve these features and other advantages and in accordance with the purpose of the disclosure, as embodied and broadly described herein, a display apparatus includes a device substrate. A light-emitting device and an encapsulating element are disposed on the device substrate. The light-emitting device is disposed on an emission area of the device substrate. The encapsulating element covers the light-emitting device. A heteromorphy lens is disposed on the encapsulating element. The heteromorphy lens includes an upper surface opposite to the encapsulating element and a lower surface toward the encapsulating element. The upper surface of the heteromorphy lens has a size smaller than the lower surface of the heteromorphy lens. A cross-section of the heteromorphy lens in a first direction is a semi-circular shape. A cross-section of the heteromorphy lens in a second direction is a polygonal shape having a concave side. The second direction is perpendicular to the first direction.

A lens passivation layer may be disposed on the encapsulating element. The lens passivation layer may cover the heteromorphy lens. A refractive index of the lens passivation layer may be smaller than a refractive index of the heteromorphy lens.

A length of the upper surface of the heteromorphy lens in the second direction may be 0.5 times a length of the lower surface of the heteromorphy lens in the second direction.

The lower surface of the heteromorphy lens may be a circular shape.

The heteromorphy lens may be in contact with the encapsulating element.

The heteromorphy lens may have a size larger than the emission area.

In another aspect, the display apparatus includes a display panel. The display panel includes light-emitting devices. An optical element is disposed on the display panel. The optical element includes heteromorphy lenses. A horizontal size of each heteromorphy lens decreases as the distance from the display panel increase. A side surface of each heteromorphy lens toward a first direction is a convex shape. A side surface of each heteromorphy lens toward a second direction is a concave shape. The second direction is perpendicular to the first direction.

The heteromorphy lenses may be disposed side by side in the first direction and the second direction.

A length in the first direction in a lower surface of each heteromorphy lens toward the display panel may be the same as a length in the second direction in the lower surface of each heteromorphy lens.

The lower surface of each heteromorphy lens may be a polygonal shape.

The optical element may include a first lens passivation layer and a second lens passivation layer. The second lens passivation layer may have a refractive index larger than that of the first lens passivation layer. The second lens passivation layer may cover the side surface of each heteromorphy lens toward the second direction.

Each of the heteromorphy lenses may have a refractive index between that of the first lens passivation layer and that of the second lens passivation layer.

An upper surface of each heteromorphy lens opposite to the display panel may be in contact with the first lens passivation layer.

The first lens passivation layer and the second lens passivation layer may extend side by side in the first direction. A horizontal width of the second lens passivation layer may be larger than a horizontal width of the first lens passivation layer.

The optical element may include a supporting substrate supporting the heteromorphy lenses.

BRIEF DESCRIPTION OF THE DRAWINGS

The accompanying drawings, which are included to provide a further understanding of the disclosure and are incorporated in and constitute a part of the disclosure, In the drawings.

DETAILED DESCRIPTION

Figure 1:
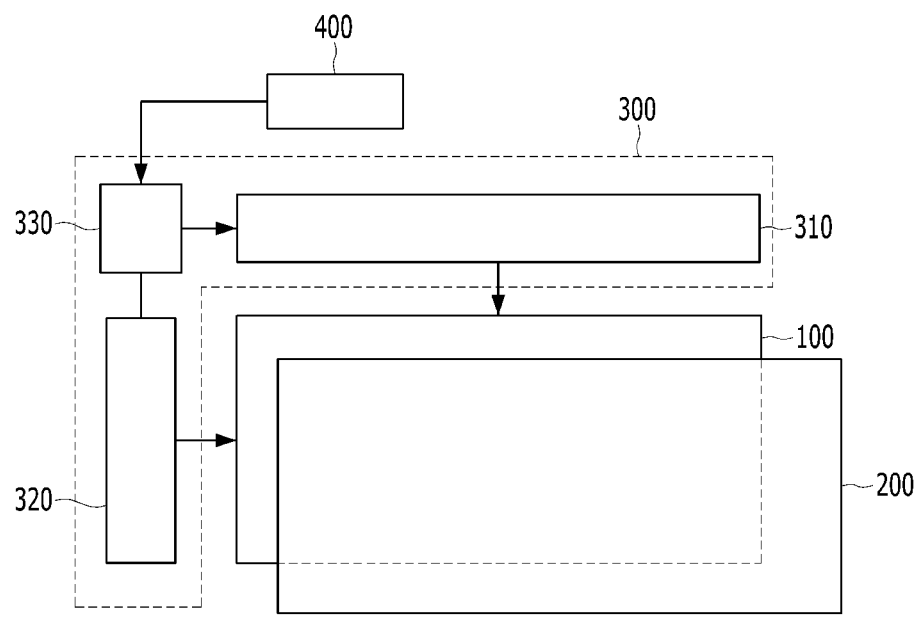
FIG. 1 is a view schematically showing a display apparatus according to an aspect of the present disclosure.

Hereinafter, details related to the above features, technical configurations, and operational effects of the aspects of the present disclosure will be clearly understood by the following detailed description with reference to the drawings, which illustrate some aspects of the present disclosure. Here, the aspects of the present disclosure are provided in order to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

(Aspects)

Figure 2:
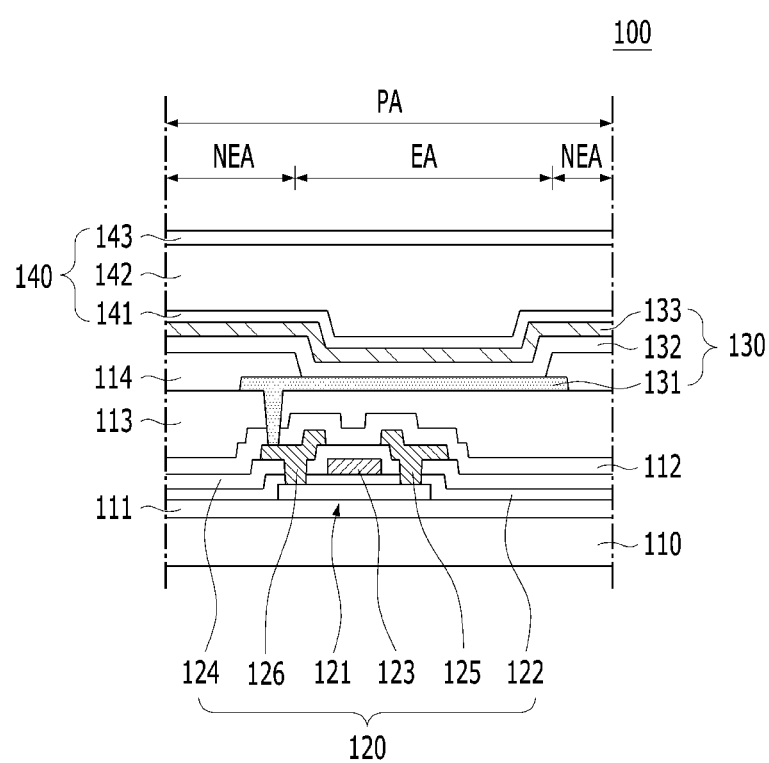
FIG. 2 is a view showing a portion of a display panel in the display apparatus according to the aspect of the present disclosure.
Figure 3:
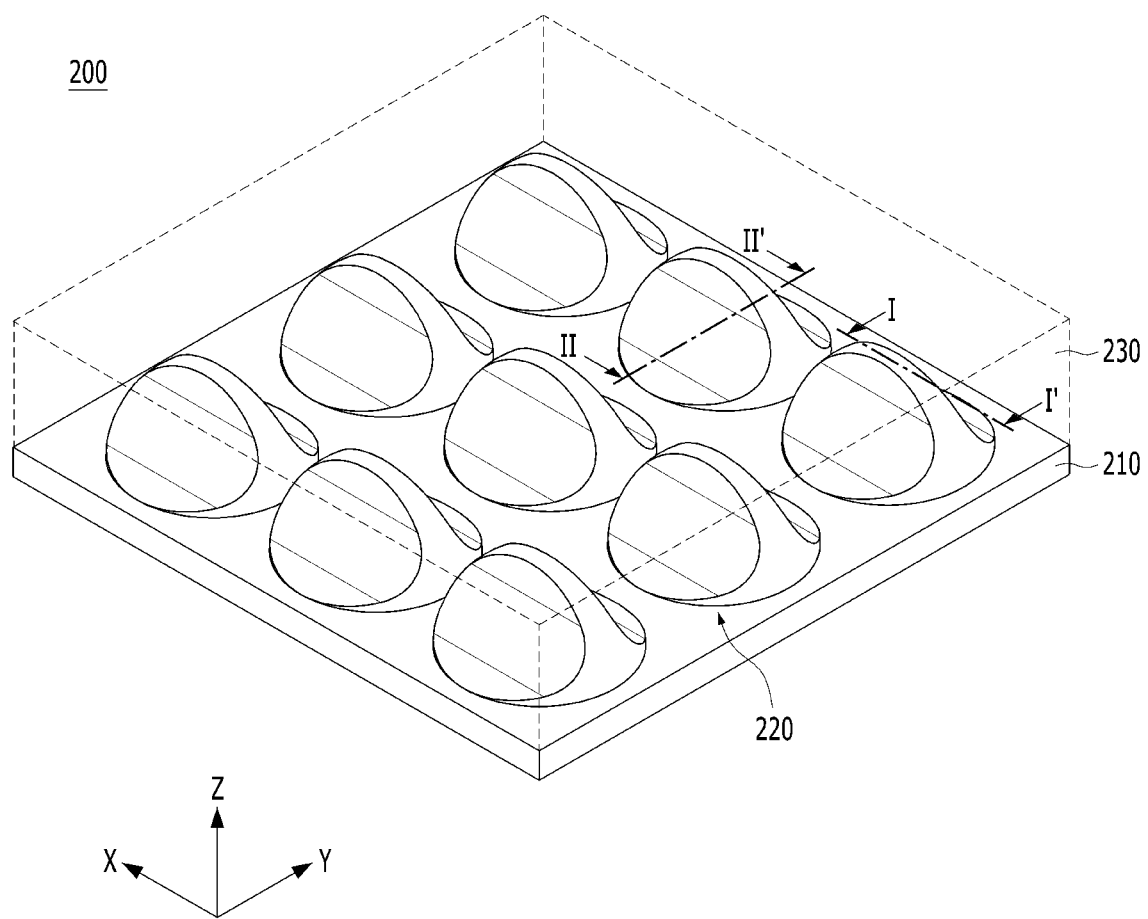
FIG. 3 is a view showing an optical element in the display apparatus according to the aspect of the present disclosure.
Figure 4:
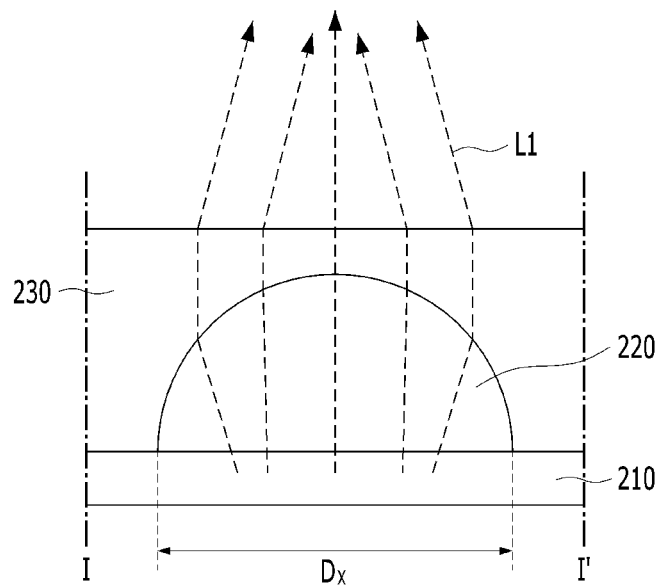
FIG. 4 is a view taken along I-I' of FIG. 3.
Figure 4:
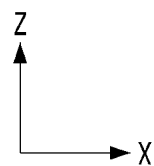
Figure 5:
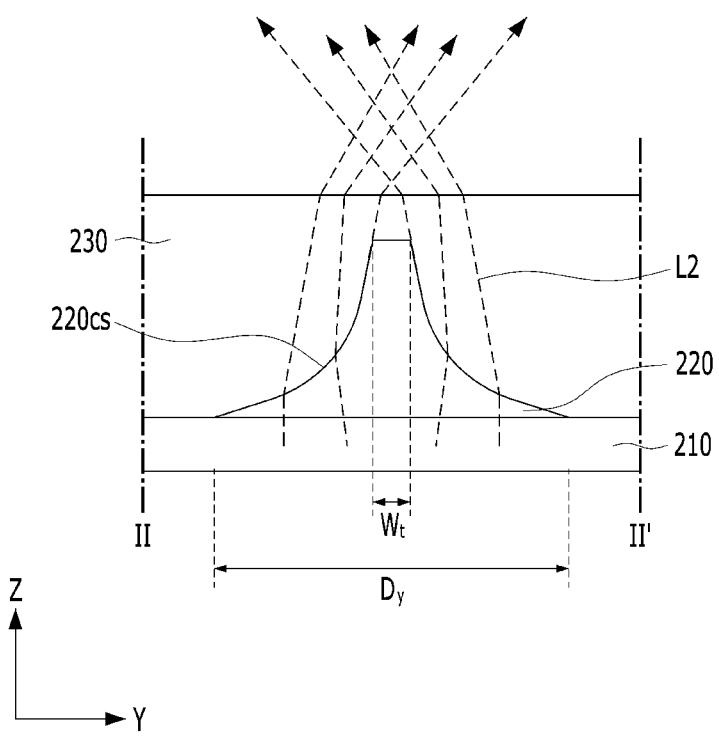
FIG. 5 is a view taken along II-II' of FIG. 3.
Figure 5:
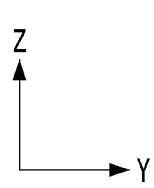

FIG. 1 is a view schematically showing a display apparatus according to an aspect of the present disclosure. FIG. 2 is a view showing a portion of a display panel in the display apparatus according to the aspect of the present disclosure. FIG. 3 is a view showing an optical element in the display apparatus according to the aspect of the present disclosure. FIG. 4 is a view taken along I-I' of FIG. 3. FIG. 5 is a view taken along II-II' of FIG. 3.

Referring to FIGS. 1 to 5, the display apparatus according to the aspect of the present disclosure may include a display panel 100 and an optical element 200. The display panel 100 may realize an image provided to user. For example, the display panel 100 may be controlled by a display driving unit 300. The display driving unit 300 may provide various signals to realize the image. For example, the display driving unit 300 may include a data driving unit 310 to apply a data signal, a scan driving unit 320 to apply a scan signal, and a timing controller 330. The timing controller 330 may apply a digital video data and a source timing control signal to the data driving unit 310, and may apply clock signals, reset clock signals and start signals to the scan driving unit 320.

The display panel 100 may include a device substrate 110. The device substrate 110 may include an insulating material. For example, the device substrate 110 may include glass or plastic. The device substrate 110 may include a plurality of pixel area PA. Each of the pixel area PA may include an emission area EA and a non-emission area NEA. The non-emission area NEA of each pixel area PA may be disposed outside the emission area EA of the corresponding pixel area PA.

A driving circuit and a light-emitting device 130 may be disposed on each pixel area PA of the device substrate 110. The driving circuit of each pixel area PA may be electrically connected to the light-emitting device 130 of the corresponding pixel area PA. For example, each driving circuit may provide a driving current corresponding to the data signal to the corresponding light-emitting device 130 according to the scan signal. For example, the driving circuit of each pixel area PA may include at least one thin film transistor 120. The thin film transistor 120 may include a semiconductor pattern 121, a gate insulating layer 122, a gate electrode 123, an interlayer insulating layer 124, a source electrode 125 and a drain electrode 126.

The semiconductor pattern 121 may include a semiconductor material. For example, the semiconductor pattern 121 may include amorphous silicon (a-Si) or polycrystalline silicon (poly-Si). The semiconductor pattern 121 may be an oxide semiconductor. For example, the semiconductor pattern 121 may include a source region, a drain region and a channel region. The channel region may be disposed between the source region and the drain region. The source region and the drain region may have a resistance lower than the channel region.

The gate insulating layer 122 may be disposed on the semiconductor pattern 121. The gate insulating layer 122 may extend beyond the semiconductor pattern 121. For example, a side surface of the semiconductor pattern 121 may be covered by the gate insulating layer 122. The gate insulating layer 122 may include an insulating material. For example, the gate insulating layer 122 may include silicon oxide (SiO) and/or silicon nitride (SiN). The gate insulating layer 122 may include a material having high dielectric constant. For example, the gate insulating layer 122 may include a High-K material, such as hafnium oxide (HfO). The gate insulating layer 122 may have a multi-layer structure.

The gate electrode 123 may be disposed on the gate insulating layer 122. The gate electrode 123 may include a conductive material. For example, the gate electrode 123 may include a metal, such as aluminum (Al), titanium (Ti), copper (Cu), chromium (Cr), molybdenum (Mo) and tungsten (W). The gate electrode 123 may be insulated from the semiconductor pattern 121 by the gate insulating layer 122. The gate electrode 123 may overlap the channel region of the semiconductor pattern 121. For example, the channel region of the semiconductor pattern 121 may have an electric conductive corresponding to a voltage applied to the gate electrode 123.

The interlayer insulating layer 124 may be disposed on the gate electrode 123. The interlayer insulating layer 124 may extend beyond the gate electrode 123. For example, a side surface of the gate electrode 123 may be covered by the interlayer insulating layer 124. The interlayer insulating layer 124 may be in contact with the gate insulating layer 122 at the outside of the gate electrode 123. The interlayer insulating layer 124 may include an insulating material. For example, the interlayer insulating layer 124 may include silicon oxide (SiO).

The source electrode 125 may be disposed on the interlayer insulating layer 124. The source electrode 125 may include a conductive material. For example, the source electrode 125 may include a metal, such as aluminum (Al), titanium (Ti), copper (Cu), chromium (Cr), molybdenum (Mo) and tungsten (W). The source electrode 125 may be insulated from the gate electrode 123 by the interlayer insulating layer 124. For example, the source electrode 125 may include a material different from the gate electrode 123. The source electrode 125 may be electrically connected to the source region of the semiconductor pattern 121. For example, the gate insulating layer 122 and the interlayer insulating layer 124 may include a source contact hole partially exposing the source region of the semiconductor pattern 121. The source electrode 125 may include a portion overlapping with the source region of the semiconductor pattern 121. For example, the source electrode 125 may be in direct contact with the source region of the semiconductor pattern 121 in the source contact hole.

The drain electrode 126 may be disposed on the interlayer insulating layer 124. The drain electrode 126 may include a conductive material. For example, the drain electrode 126 may include a metal, such as aluminum (Al), titanium (Ti), copper (Cu), chromium (Cr), molybdenum (Mo) and tungsten (W). The drain electrode 126 may be insulated from the gate electrode 123 by the interlayer insulating layer 124. For example, the drain electrode 126 may include a material different from the gate electrode 123. The drain electrode 126 may include the same material as the source electrode 125. The drain electrode 126 may be electrically connected to the drain region of the semiconductor pattern 121. The drain electrode 126 may be spaced away from the source electrode 125. For example, the gate insulating layer 122 and the interlayer insulating layer 124 may include a drain contact hole partially exposing the drain region of the semiconductor pattern 121. The drain electrode 126 may include a portion overlapping with the drain region of the semiconductor pattern 121. For example, the drain electrode 126 may be in direct contact with the drain region of the semiconductor pattern 121 in the drain contact hole.

A device buffer layer 111 may be disposed between the device substrate 110 and the driving circuit of each pixel area PA. The device buffer layer 111 may prevent pollution due to the device substrate 110 in a process of forming the driving circuit. For example, a surface of the device substrate 110 toward the driving circuit of each pixel area PA may be completely covered by the device buffer layer 111. The device buffer layer 111 may include an insulating material. For example, the device buffer layer 111 may include silicon oxide (SiO) and/or silicon nitride (SiN). The device buffer layer 111 may have a multi-layer structure.

A lower passivation layer 112 may be disposed between the driving circuit of each pixel area PA and the light-emitting device 130. The lower passivation layer 112 may prevent the damage of the driving circuit due to the external impact and moisture. For example, the thin film transistor 120 of each pixel area PA may be completely covered by the lower passivation layer 112. The lower passivation layer 112 may extend beyond each pixel area PA. For example, the lower passivation layer 112 on each pixel area PA may be coupled to the lower passivation layer 112 on adjacent pixel area PA. The lower passivation layer 112 may include an insulating material. For example, the lower passivation layer 112 may include silicon oxide (SiO) and/or silicon nitride (SiN).

An over-coat layer 130 may be disposed between the lower passivation layer 112 and the light-emitting device 130 of each pixel area PA. The over-coat layer 130 may remove a thickness difference due to the driving circuit of each pixel area PA. For example, a surface of the over-coat layer 130 opposite to the device substrate 110 may be a flat surface. The over-coat layer 113 may include an insulating material. The over-coat layer 113 may include a material different from the lower passivation layer 112. For example, the over-coat layer 113 may include an organic insulating material.

The light-emitting device 130 of each pixel area PA may be disposed on the over-coat layer 113. The light-emitting device 130 may emit light displaying a specific color. For example, the light-emitting device 130 may include a first electrode 131, a light-emitting layer 132 and a second electrode 133, which are sequentially stacked on the over-coat layer 113.

The first electrode 131 may include a conductive material. The first electrode 131 may include a material having high reflectance. For example, the first electrode 131 may include a metal, such as aluminum (Al) and silver (Ag). The first electrode 131 may have a multi-layer structure. For example, the first electrode 131 may have a structure in which a reflective electrode formed of a metal is disposed between transparent electrodes formed of a transparent conductive material, such as ITO and IZO.

The light-emitting layer 132 may generate light having luminance corresponding to a voltage difference between the first electrode 131 and the second electrode 133. For example, the light-emitting layer 132 may include an emission material layer (EML) having an emission material. The emission material may include an organic material, an inorganic material, or a hybrid material. For example, the display apparatus according to the aspect of the present disclosure may be an organic light-emitting display apparatus including the emission material layer formed of an organic material. The light-emitting layer 132 may have a multi-layer structure. For example, the light-emitting layer 132 may further include at least one of a hole injection layer (HIL), a hole transport layer (HTL), an electron transport layer (ETL) and an electron injection layer (EIL). Thus, in the display apparatus according to the aspect of the present disclosure, emission efficiency of each light-emitting device 130 may be improved.

The second electrode 133 may include a conductive material. The second electrode 133 may include a material different from the first electrode 131. A transmittance of the second electrode 133 may be higher than a transmittance of the first electrode 131. For example, the second electrode 133 may be a transparent electrode composed of a transparent conductive material, such as ITO and IZO. Thus, in the display apparatus according to the aspect of the present disclosure, the light generated from the light-emitting layer 132 of each pixel area PA may be emitted though the second electrode 133 of the corresponding pixel area PA.

The first electrode 131 of each pixel area PA may be electrically connected to the driving circuit of the corresponding pixel area PA. For example, the first electrode 131 of the light-emitting device 130 in each pixel area PA may be electrically connected to the drain electrode 126 of the thin film transistor 120 in the corresponding pixel area PA. The lower passivation layer 112 and the over-coat layer 113 may include electrode contact holes partially exposing the drain electrode 126 of the thin film transistor 120 in each pixel area PA. The first electrode 131 in each pixel area PA may include a portion overlapping with the drain electrode 126 of the thin film transistor 120 in the corresponding pixel area PA. For example, the first electrode 131 of the light-emitting device 130 in each pixel area PA may be in direct contact with the drain electrode 126 of the thin film transistor 120 in the corresponding pixel area PA through one of the electrode contact holes.

A bank insulating layer 114 may be disposed on the over-coat layer 113. The bank insulating layer 114 may include an insulating material. For example, the bank insulating layer 114 may include an organic insulating material. The bank insulating layer 114 may include a material different from the over-coat layer 113. The bank insulating layer 114 may define the emission area EA in each pixel area PA. For example, an edge of the first electrode 131 in each pixel area PA may be covered by the bank insulating layer 114. The light-emitting layer 132 and the second electrode 133 in each pixel area PA may be stacked on a portion of the first electrode 131 in the corresponding pixel area PA which is exposed by the bank insulating layer 114. For example, the bank insulating layer 140 may overlap the non-emission area NEA of each pixel area PA. Thus, in the display apparatus according to the aspect of the present disclosure, the light-emitting device 130 of each pixel area PA may be controlled, independently.

The light-emitting layer 132 in each pixel area PA may extend on the bank insulating layer 114. The light-emitting device 130 in each pixel area PA may emit the light having the wavelength as the light-emitting device 130 in adjacent pixel area PA. For example, the light-emitting layer 132 in each pixel area PA may be connected to the light-emitting layer 132 in adjacent pixel area PA. Thus, in the display apparatus according to the aspect of the present disclosure, a process of forming the light-emitting layer 132 may be simplified.

The second electrode 133 in each pixel area PA may extend on the bank insulating layer 114. A voltage applied to the second electrode 133 in each pixel area PA may be the same as a voltage applied to the second electrode 133 in adjacent pixel area PA. For example, the second electrode 133 in each pixel area PA may be electrically connected to the second electrode 133 in adjacent pixel area PA. Thus, in the display apparatus according to the aspect of the present disclosure, the luminance of each pixel area PA may be controlled by the data signal. The second electrode 133 in each pixel area PA may be in direct contact with the second electrode 133 in adjacent pixel area PA. For example, the second electrode 133 in each pixel area PA may include the same material as the second electrode 133 in adjacent pixel area PA. Therefore, in the display apparatus according to the aspect of the present disclosure, a process of forming the second electrode 133 may be simplified.

An encapsulating element 140 may be disposed on the light-emitting device 130 of each pixel area PA. The encapsulating element 140 may prevent the damage of the light-emitting devices 130 due to the external impact and moisture. The encapsulating element 140 may extend beyond each pixel area PA. For example, the driving circuit and the light-emitting device 130 of each pixel area PA may be completely covered by the encapsulating element 140. The encapsulating element 140 may have a multi-layer structure. For example, the encapsulating element 140 may include a first encapsulating layer 141, a second encapsulating layer 142 and a third encapsulating layer 143, which are sequentially stacked on the device substrate 110. The first encapsulating layer 141, the second encapsulating layer 142 and the third encapsulating layer 143 may include an insulating material. For example, the first encapsulating layer 141 and the third encapsulating layer 143 may include an inorganic insulating material, and the second encapsulating layer 142 may include an organic insulating material. Thus, in the display apparatus according to the aspect of the present disclosure, the damage of the light-emitting devices 130 due to the external impact and moisture may be effectively prevented. A thickness difference due to the light-emitting devices 130 of each pixel area PA may be removed by the second encapsulating layer 142. For example, a surface of the encapsulating element 140 opposite to the device substrate 110 may be a flat surface.

The optical element 200 may be disposed on the display panel 100. The optical element 200 may be disposed on a path of the light emitted from each light-emitting device 130. For example, the optical element 200 may be disposed on the encapsulating element 140. The optical element 200 may change a travelling direction of the light emitted from the display panel 100. For example, the optical element 200 may include heteromorphy lenses 220 disposed side by side on a supporting substrate 210. The supporting substrate 210 may include an insulating material. The supporting substrate 210 may include a transparent material. For example, the supporting substrate 210 may include glass or plastic.

The heteromorphy lenses 220 may be disposed side by side in a first direction X and a second direction Y perpendicular to the first direction X. For example, the heteromorphy lenses 220 may be arranged in a matrix shape. A horizontal width of each heteromorphy lens 220 may decrease as the distance from the supporting substrate 210 increase. For example, a lower surface of each heteromorphy lens 220 toward the display panel 100 may have a size larger than an upper surface of each heteromorphy lens 220 opposite to the display panel 100.

A side surface of each heteromorphy lens 220 toward the first direction X may have a shape different from a side surface of each heteromorphy lens 220 toward the second direction Y. For example, the side surface of each heteromorphy lens 220 toward the first direction X may be a convex shape, and the side surface of each heteromorphy lens 220 toward the second direction Y may be a concave shape. A cross-section of each heteromorphy lens 220 in the first direction X may be a semi-circular shape. A cross-section of each heteromorphy lens 220 in the second direction Y may be a parallelogram shape having a concave side surface 220cs. Thus, in the display apparatus according to the aspect of the present disclosure, the light L1 travelling to the first direction X from the display panel 100 may be condensed by the convex side surface of each heteromorphy lens 220. And, in the display apparatus according to the aspect of the present disclosure, the light L2 travelling to the second direction Y from the display panel 100 may be diffused by the concave side surface 220cs of each heteromorphy lens 220. Therefore, in the display apparatus according to the aspect of the present disclosure, the luminance may be improved in the second direction Y, and the viewing angle may be limited in the first direction X.

The optical element 200 may further include lens passivation layer 230 covering the heteromorphy lenses 220. For example, the lens passivation layer 230 may be disposed on the supporting substrate 210. The lens passivation layer 230 may prevent the damage of the heteromorphy lenses 220 due to the external impact. The lens passivation layer 230 may include an insulating material. For example, the lens passivation layer 230 may include an organic insulating material. A thickness difference due to the heteromorphy lenses 220 may be removed by the lens passivation layer 230. For example, a surface of the lens passivation layer 230 opposite to the display panel 100 may be a flat surface. Thus, in the display apparatus according to the aspect of the present disclosure, unintentional scattering of the light due to the surface roughness of the lens passivation layer 230 may be prevented. Therefore, in the display apparatus according to the aspect of the present disclosure, the quality deterioration of the image may be prevented.

A refractive index of the lens passivation layer 230 may be smaller than a refractive index of each heteromorphy lens 220. Thus, in the display apparatus according to the aspect of the present disclosure, the light passing through each heteromorphy lens 220 may be refracted at the interface between a surface of each heteromorphy lens 220 and the lens passivation layer 230. That is, in the display apparatus according to the aspect of the present disclosure, the light passing through the surface of each heteromorphy lens 220 opposite to the display panel 100 at a predetermined angle or more may be reflected into the inside of the corresponding heteromorphy lens 220 due to the difference in the refractive index between each heteromorphy lens 220 and the lens passivation layer 230. Therefore, in the display apparatus according to the aspect of the present disclosure, the condensing of the light by the heteromorphy lenses 220 may be effectively performed.

Accordingly, the display apparatus according to the aspect of the present disclosure may include the optical element 200 on a path of the light emitted from each light-emitting device 130 of the display panel 100, wherein the optical element 200 may include the heteromorphy lenses 220 disposed side by side on the supporting substrate 210, wherein the side surface of each heteromorphy lens 220 toward the first direction X may be a convex shape, and wherein the side surface of each heteromorphy lens 220 toward the second direction X may be a concave shape. Thus, in the display apparatus according to the aspect of the present disclosure, the light travelling in the first direction X may be condensed, and the light travelling in the second direction Y may be diffused due to the heteromorphy lenses 220. Thereby, in the display apparatus according to the aspect of the present disclosure, the reduction in luminance may be minimized, and the narrow viewing angle may be realized.

Furthermore, in the display apparatus according to the aspect of the present disclosure, the optical element 200 may include the lens passivation layer 230 covering the heteromorphy lenses 220, wherein the lens passivation layer 230 may have a refractive index smaller than each heteromorphy lens 220. Thus, in the display apparatus according to the aspect of the present disclosure, the light at a predetermined angle or more may not pass the interface between the surface of each heteromorphy lens 220 opposite to the display panel 100 and the lens passivation layer 230. Thus, in the display apparatus according to the aspect of the present disclosure, the limitation of the viewing angle in the first direction X by the optical element 200 may be effectively performed.

Table 1 shows the relative efficiency of condensing and diffusion according to a ratio of a length Dx in the first direction X and a length Dy in the second direction Y at the lower surface of the heteromorphy lens 220 toward the display panel 100 in the display apparatus according to the aspect of the present disclosure.

TABLE 1

| Dy/Dx | 1/3 | 1/2 | 1 | 2 | 2 |
|---|---|---|---|---|---|
| Relative efficiency of condensing | 80% | 90% | 100% | 100% | 100% |
| Relative efficiency of diffusion | 100% | 100% | 100% | 90% | 80% |

Referring to Table 1, it can be seen that when the length Dx in the first direction X at the lower surface of the heteromorphy lens 220 is relatively long, the condensing efficiency of the light is lowered, and when the length Dy in the second direction Y at the lower surface of the heteromorphy lens 220 is relatively long, the diffusion efficiency of the light is lowered. Thus, in the display apparatus according to the aspect of the present disclosure, the length Dx in the first direction X at the lower surface of the heteromorphy lens 220 may be the same as the length Dy in the second direction Y at the lower surface of the heteromorphy lens 220. Therefore, in the display apparatus according to the aspect of the present disclosure, decreasing of the condensing efficiency and the diffusion efficiency due to the shape of the heteromorphy lenses 220 may be prevented.

Table 2 shows the relative efficiency of condensing and diffusion according to a ratio of the length Dy in the second direction Y at the lower surface of the heteromorphy lens 220 and a length Wt in the second direction Y at an upper surface of the heteromorphy lens 220 opposite to the display panel 100 in the display apparatus according to the aspect of the present disclosure.

TABLE 2

| Wt/Dy | 0.3 | 0.5 | 0.8 | 1 |
|---|---|---|---|---|
| Relative efficiency of condensing | 101.1% | 101.3% | 100.8% | 100.0% |
| Relative efficiency of diffusion | 100.2% | 103.8% | 102.5% | 100.0% |
| Wt/Dy | 1.2 | 1.5 | 1.8 | 2 |
| Relative efficiency of condensing | 99.8% | 99.5% | 99.2% | 99.2% |
| Relative efficiency of diffusion | 98.1% | 95.9% | 93.2% | 90.4% |

Referring to Table 2, it can be seen that when the length Wt in the second direction Y at the upper surface of the heteromorphy lens 220 exceeds the length Dy in the second direction Y at the lower surface of the heteromorphy lens 220, both of the condensing efficiency and the diffusion efficiency are lowered. Thus, in the display apparatus according to the aspect of the present disclosure, the upper surface of each heteromorphy lens 220 may have a size smaller than the lower surface of each heteromorphy lens 220. And, referring to Table 2, it can be seen that when the length Wt in the second direction Y at the upper surface of the heteromorphy lens 220 is 0.5 times the length Dy in the second direction Y at the lower surface of the heteromorphy lens 220, both of the condensing efficiency and the diffusion efficiency are maximized. Thus, the display apparatus according to the aspect of the present disclosure may include the optical element 200 on the display panel 100, wherein the optical element 200 may include the heteromorphy lenses 220 disposed side by side, and wherein the length Wt in the second direction Y at the upper surface is 0.5 times the length Dy in the second direction Y at the lower surface in each heteromorphy lens 220. Therefore, in the display apparatus according to the aspect of the present disclosure, the reduction in luminance may be minimized, and the viewing angle may be effectively limited.

Figure 6:
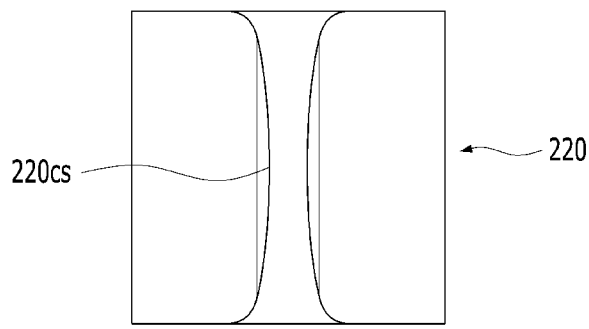
FIGS. 6 to 11 are views showing the display apparatus according to another aspect of the present disclosure.
Figure 6:
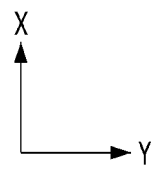
Figure 7:
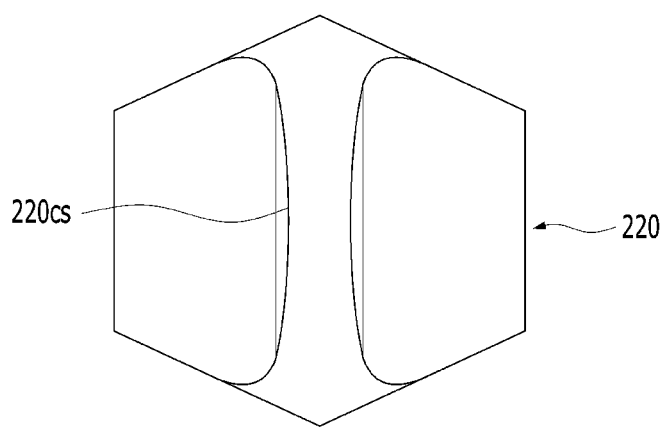
Figure 7:
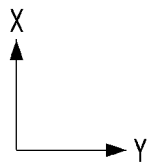

The display apparatus according to the aspect of the present disclosure is described that the lower surface of each heteromorphy lens 220 is a circular shape. However, the display apparatus according to another aspect of the present disclosure may include the heteromorphy lenses 220 having the lower surface of a polygonal shape. For example, in the display apparatus according to another aspect of the present disclosure, the lower surface of each heteromorphy lens 220 on a path of the light emitted from each light-emitting device may be a regular square shape, as shown in FIG. 6. Alternately, in the display apparatus according to another aspect of the present disclosure, the lower surface of each heteromorphy lens 220 on a path of the light emitted from each light-emitting device may be a regular hexagonal shape, as shown in FIG. 7. Thus, in the display apparatus according to another aspect of the present disclosure, the process efficiency for forming the heteromorphy lenses 220 may be improved.

Figure 8:
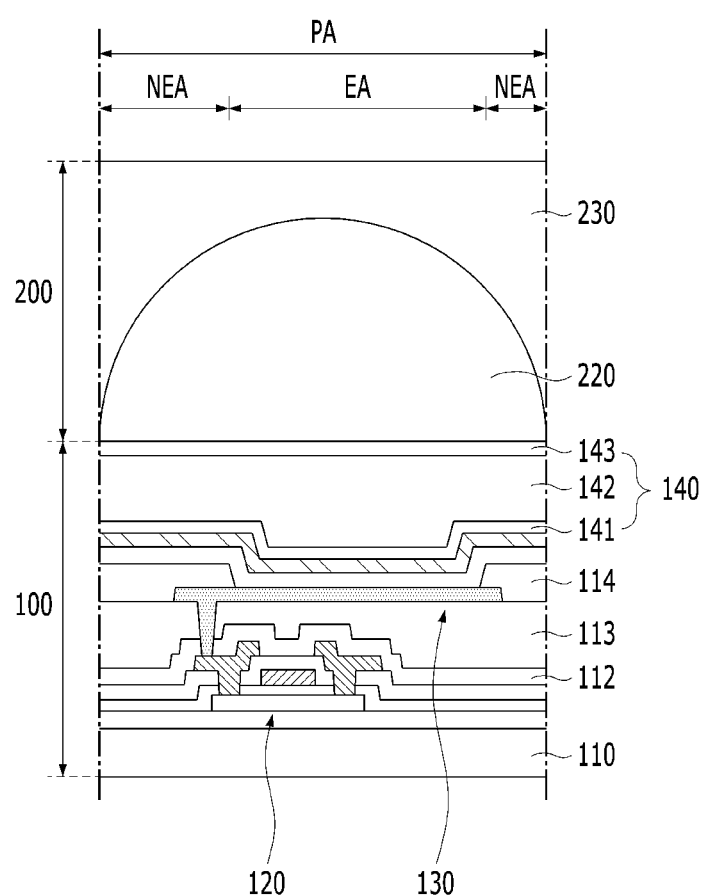

The display apparatus according to the aspect of the present disclosure is described that the heteromorphy lenses 220 may be arranged on the supporting substrate 210. However, in the display apparatus according to another aspect of the present disclosure, the optical element 200 may not include the supporting substrate 210. For example, in the display apparatus according to another aspect of the present disclosure, the optical element 200 may be arranged on the encapsulating element 140 of the display panel 100, as shown in FIG. 8. The lower surface of each heteromorphy lens 220 toward the display panel 100 may be in direct contact with the encapsulating element 140. Thus, in the display apparatus according to another aspect of the present disclosure, a process of attaching the optical element 200 to the display panel 100 may be omitted. Therefore, in the display apparatus according to another aspect of the present disclosure, the overall thickness may be reduced, and the process efficiency may be improved.

The display apparatus according to the aspect of the present disclosure is described that the arrangement of the heteromorphy lenses 220 may be not related to the pixel areas PA of the display panel 100. However, in the display apparatus according to another aspect of the present disclosure, each of the heteromorphy lenses 220 may overlap one of the pixel areas PA. For example, in the display apparatus according to another aspect of the present disclosure, a horizontal width of each heteromorphy lens 220 may be the same as a horizontal width of each pixel area PA, as shown in FIG. 8. Each of the heteromorphy lenses 220 may have the horizontal width larger than that of the emission area EA defined in each pixel area PA. Thus, in the display apparatus according to another aspect of the present disclosure, the travelling direction of the light emitted from each light-emitting device 130 may be effectively controlled.

Figure 9:
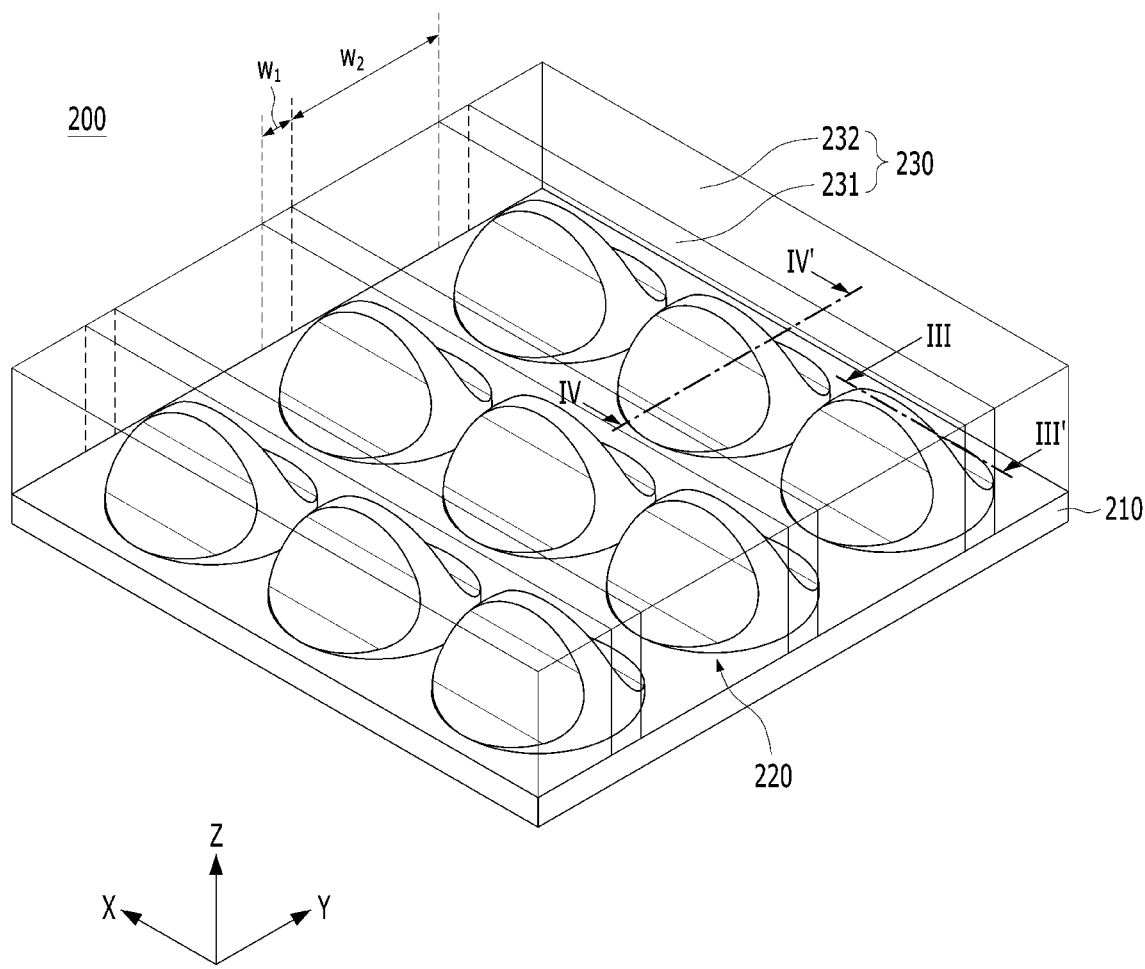
Figure 10:
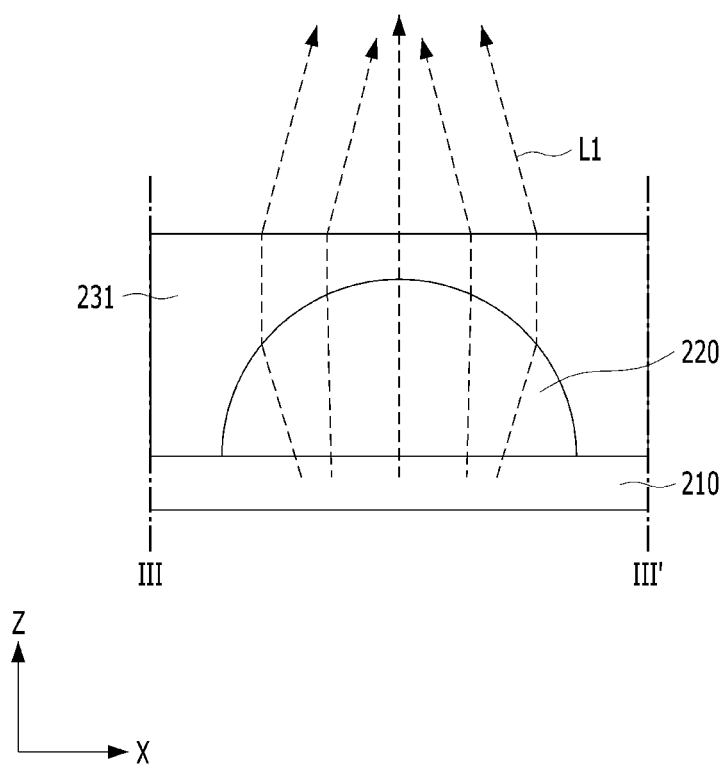
Figure 11:
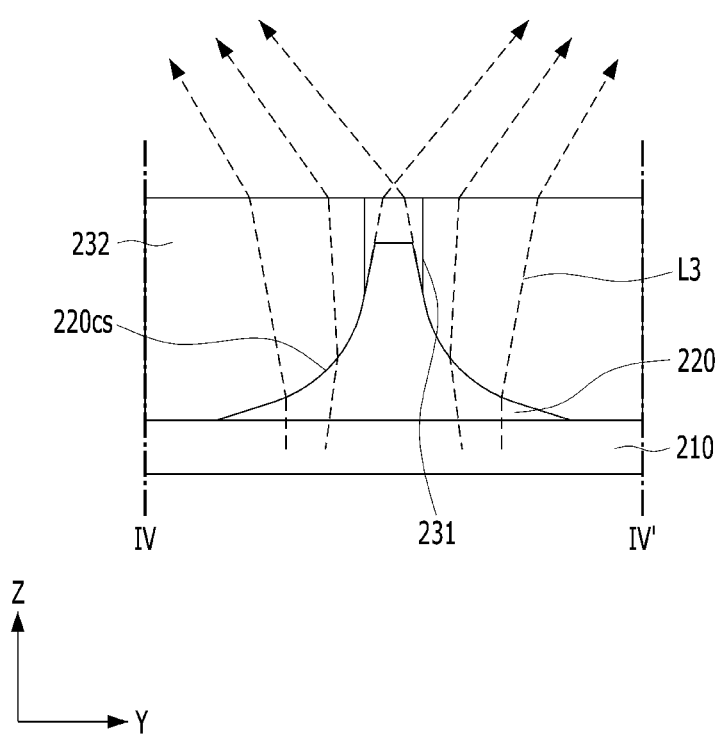

The display apparatus according to the aspect of the present disclosure is described that the heteromorphy lenses 220 may be covered single lens passivation layer 230. However, in the display apparatus according to another aspect of the present disclosure, the optical element 200 may include various lens passivation layer 230. For example, in the display apparatus according to another aspect of the present disclosure, the lens passivation layer 230 covering the heteromorphy lenses 220 may be composed of a first lens passivation layer 231 and a second lens passivation layer 232, as shown in FIGS. 9 to 11. The first lens passivation layer 231 may cover the convex side surface of each heteromorphy lens 220. The second lens passivation layer 232 may cover the concave side surface 220*cs* of each heteromorphy lens 220. The first lens passivation layer 231 and the second lens passivation layer 232 may extend side by side. For example, the upper surface of each heteromorphy lens 220 may be in contact with the first lens passivation layer 231. A horizontal width W2 of the second lens passivation layer 232 may be larger than a horizontal width W1 of the first lens passivation layer 231.

The second lens passivation layer 232 may include a material different from the first lens passivation layer 231. For example, the second lens passivation layer 232 may have a refractive index larger than that of the first lens passivation layer 231. For example, the first lens passivation layer 231 may have a refractive index smaller than that of each heteromorphy lens 220. The second lens passivation layer 232 may have a refractive index greater than that of each heteromorphy lens 220. For example, each of the heteromorphy lenses 220 may have a refractive index between that of the first lens passivation layer 231 and that of the second lens passivation layer 232. Thus, in the display apparatus according to another aspect of the present disclosure, the condensing degree of the light in the first direction X may maintain by a different in the refractive index between each heteromorphy lens 220 and the first lens passivation layer 231, and the diffusion degree of the light in the second direction Y may be improved by a difference in the refractive index between each heteromorphy lens 220 and the second lens passivation layer 232. Therefore, in the display apparatus according to another aspect of the present disclosure, the narrow viewing angle may be realized without the reduction in luminance.

In the result, the display apparatus according to the aspects of the present disclosure may include the heteromorphy lenses on a path of the light emitted from the light-emitting devices, wherein a size of each heteromorphy lens may decrease as the distance from the light-emitting devices increase, and wherein each heteromorphy lens may include a convex side surface toward the first direction and a concave side surface toward the second direction perpendicular to the first direction. Thus, in the display apparatus according to the aspects of the present disclosure, the viewing angle in the first direction may be limited, and the luminance in the second direction may be improved due to the heteromorphy lenses. Thereby, in the display apparatus according to the aspects of the present disclosure, the reduction in luminance may be minimized, and the narrow viewing angle may be realized.

What is claimed is:

1. A display apparatus comprising:
a light-emitting device disposed on an emission area of a device substrate;
an encapsulating element disposed on the device substrate and covering the light-emitting device; and
a heteromorphy lens disposed on the encapsulating element,
wherein an upper surface of the heteromorphy lens opposite to the encapsulating element has a size smaller than a lower surface of the heteromorphy lens toward the encapsulating element,
wherein a cross-section of the heteromorphy lens in a first direction has a semi-circular shape,
wherein a cross-section of the heteromorphy lens in a second direction perpendicular to the first direction has a polygonal shape
wherein both side surfaces of the polygonal shape have a concave shape, and
wherein an upper surface of the polygonal shape between the side surfaces has a flat shape.

2. The display apparatus according to claim 1, further comprising a lens passivation layer disposed on the encapsulating element and covering the heteromorphy lens,
wherein the lens passivation layer has a refractive index that is smaller than a refractive index of the heteromorphy lens.

3. The display apparatus according to claim 1, wherein the upper surface of the heteromorphy lens in the second direction has a length that is 0.5 times a length of the lower surface of the heteromorphy lens in the second direction.

4. The display apparatus according to claim 1, wherein the lower surface of the heteromorphy lens is a circular shape.

5. The display apparatus according to claim 1, wherein the heteromorphy lens is in contact with the encapsulating element.

6. The display apparatus according to claim 1, wherein the heteromorphy lens has a size larger than the emission area.

7. A display apparatus comprising:
a display panel including light-emitting devices; and
an optical element on the display panel,
wherein the optical element includes heteromorphy lenses, a horizontal size of each heteromorphy lens decreasing as the distance from the display panel increase,
wherein a side surface of each heteromorphy lens toward a first direction has a convex shape,
wherein both side surfaces of each heteromorphy lens toward a second direction perpendicular to the first direction have a concave shape, and
wherein an upper surface of each heteromorphy lens between the both side surfaces toward the second direction has a flat shape.

8. The display apparatus according to claim 7, wherein the heteromorphy lenses are disposed side by side in the first direction and the second direction.

9. The display apparatus according to claim 7, wherein a length in the first direction in a lower surface of each heteromorphy lens toward the display panel is the same as a length in the second direction in the lower surface of each heteromorphy lens.

10. The display apparatus according to claim 9, wherein the lower surface of each heteromorphy lens is a polygonal shape.

11. The display apparatus according to claim 7, wherein the optical element includes a first lens passivation layer and a second lens passivation layer which has a refractive index larger than that of the first lens passivation layer, and
wherein the second lens passivation layer covers the side surface of each heteromorphy lens toward the second direction.

12. The display apparatus according to claim 11, wherein each of the heteromorphy lenses has a refractive index between that of the first lens passivation layer and that of the second lens passivation layer.

13. The display apparatus according to claim 11, wherein an upper surface of each heteromorphy lens opposite to the display panel is in contact with the first lens passivation layer.

14. The display apparatus according to claim 13, wherein the first lens passivation layer and the second lens passivation layer extend side by side in the first direction, and
wherein a horizontal width of the second lens passivation layer is larger than a horizontal width of the first lens passivation layer.

15. The display apparatus according to claim 7, wherein the optical element includes a supporting substrate supporting the heteromorphy lenses.

* * * * *